United States Patent [19]

Becker

[11] 4,083,000
[45] Apr. 4, 1978

[54] ROTATING DISC MULTIELEMENT POLYPHASE METER

[75] Inventor: Dale F. Becker, Seneca, S.C.

[73] Assignee: Sangamo Weston, Inc., Springfield, Ill.

[21] Appl. No.: 720,602

[22] Filed: Sep. 7, 1976

[51] Int. Cl.² .................. G01R 11/04; G01R 11/06
[52] U.S. Cl. .................................................. 324/137
[58] Field of Search .............. 324/103 R, 116, 137, 324/138, 152, 156

[56] References Cited

U.S. PATENT DOCUMENTS

| | | | |
|---|---|---|---|
| 2,110,418 | 3/1938 | Green | 324/137 |
| 2,209,969 | 8/1940 | Green | 324/137 X |
| 3,144,602 | 8/1964 | Ramsey | 324/137 |
| 3,652,936 | 3/1972 | Burkhart | 324/137 |
| 3,796,953 | 3/1974 | Zisa et al. | 324/137 |
| 3,805,154 | 4/1974 | Halstead et al. | 324/103 R |
| 3,981,439 | 9/1976 | Ham | 324/103 R X |

FOREIGN PATENT DOCUMENTS 32,307    1970    Japan ..................... 324/137

*Primary Examiner*—Gerard R. Strecker
*Attorney, Agent, or Firm*—Emrich, Root, O'Keeffe & Lee

[57] ABSTRACT

A single disc multielement polyphase watthour meter having first and second electromagnetic assemblies which apply torque to the disc, the electromagnetic assemblies being mounted with the longitudinal axes thereof located respectively in spaced parallel planes extending parallel to a baseplate of the meter. The meter register includes only decade gearing and the input drive member thereof is coupled to a shaft which mounts the disc over a coupling gear box which includes ratio gearing which adapts a given register for use in registering power consumption in power systems of different current and power ratings.

6 Claims, 13 Drawing Figures

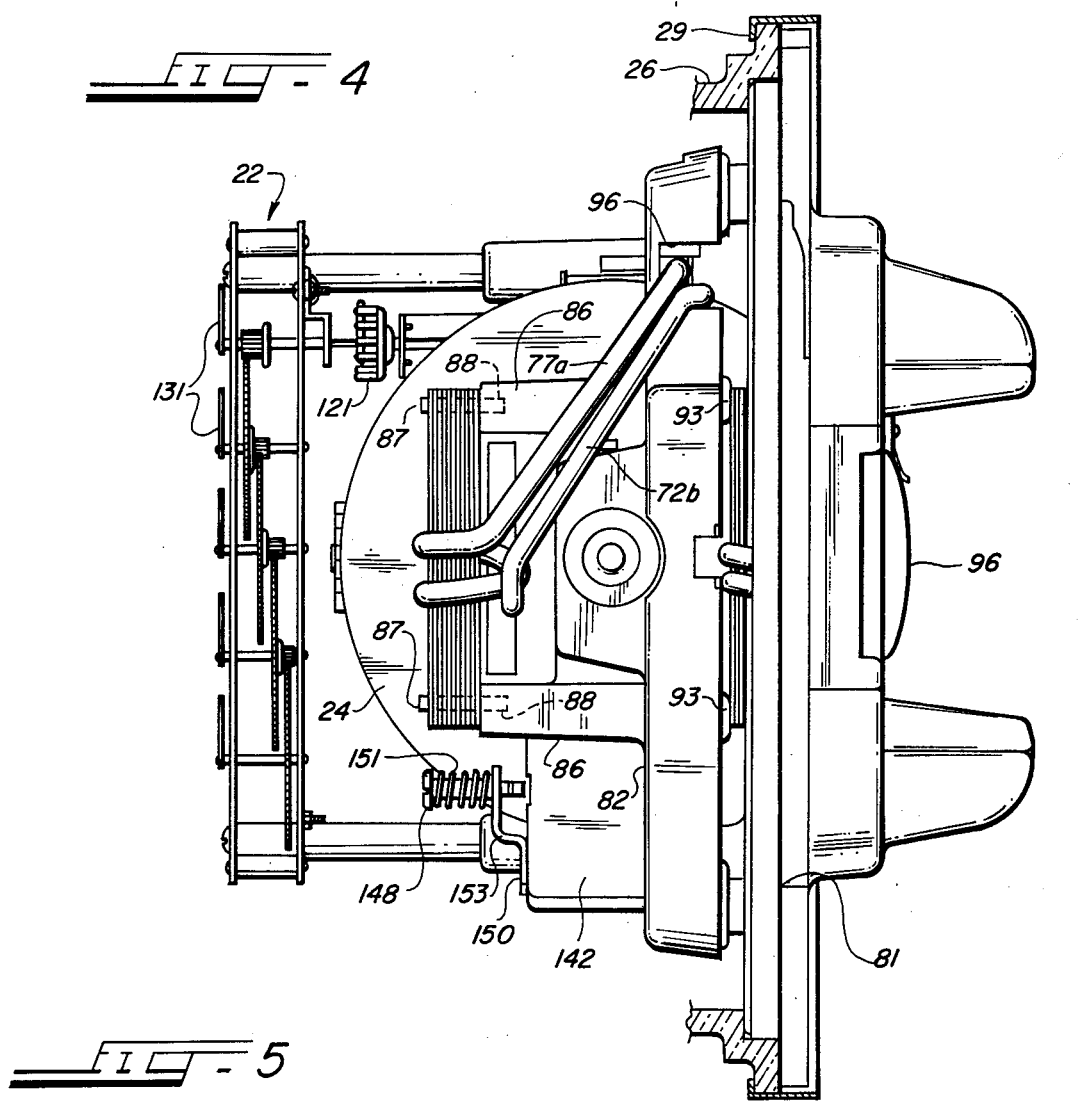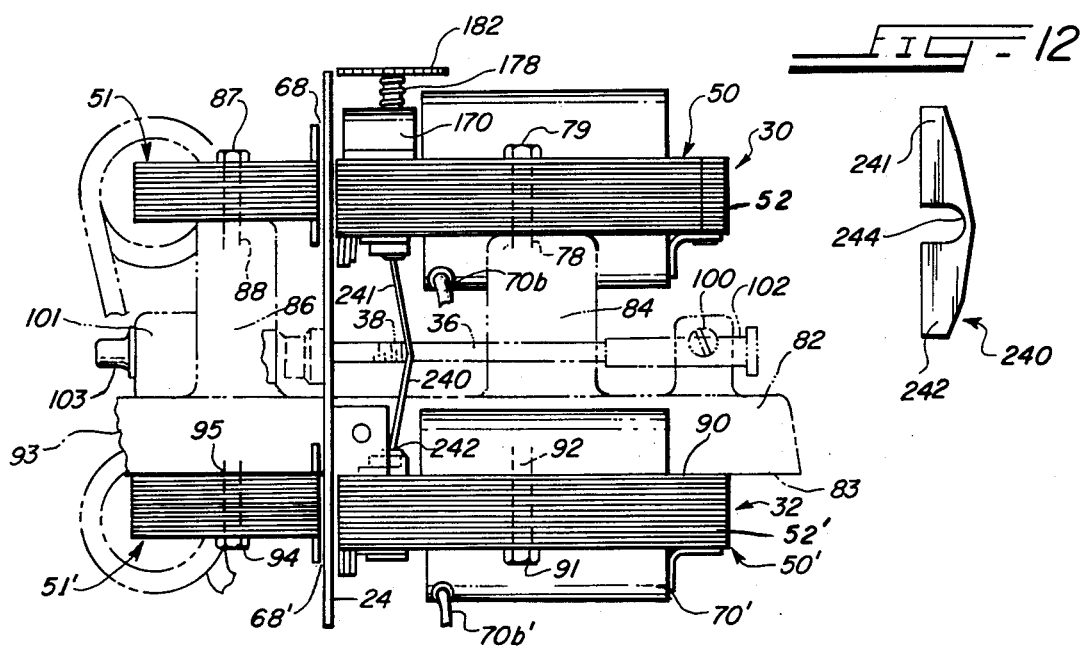

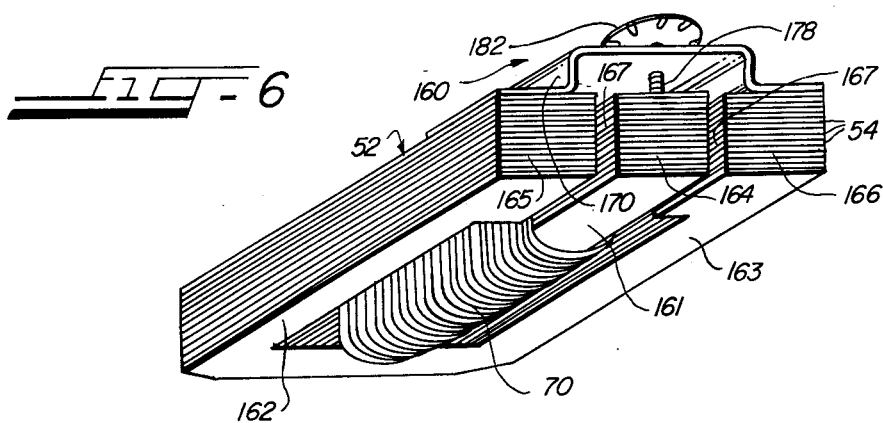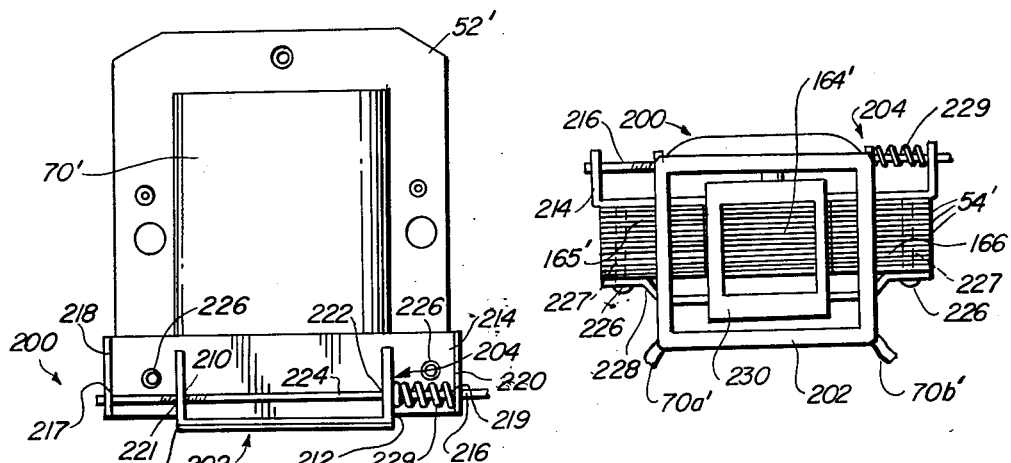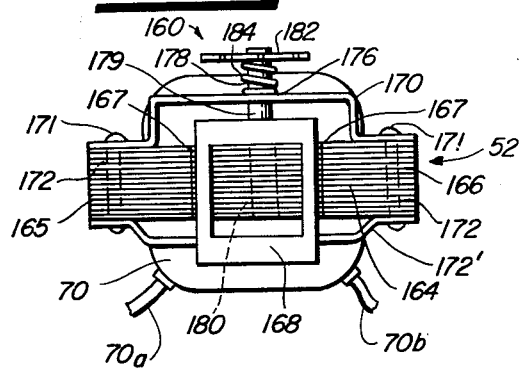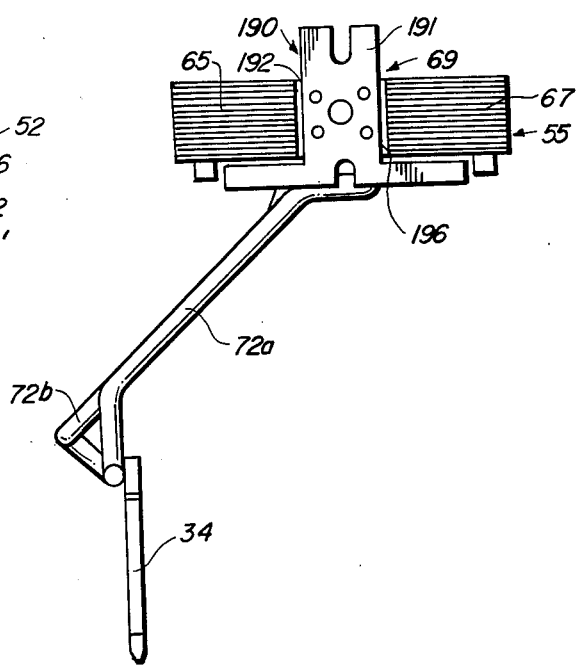

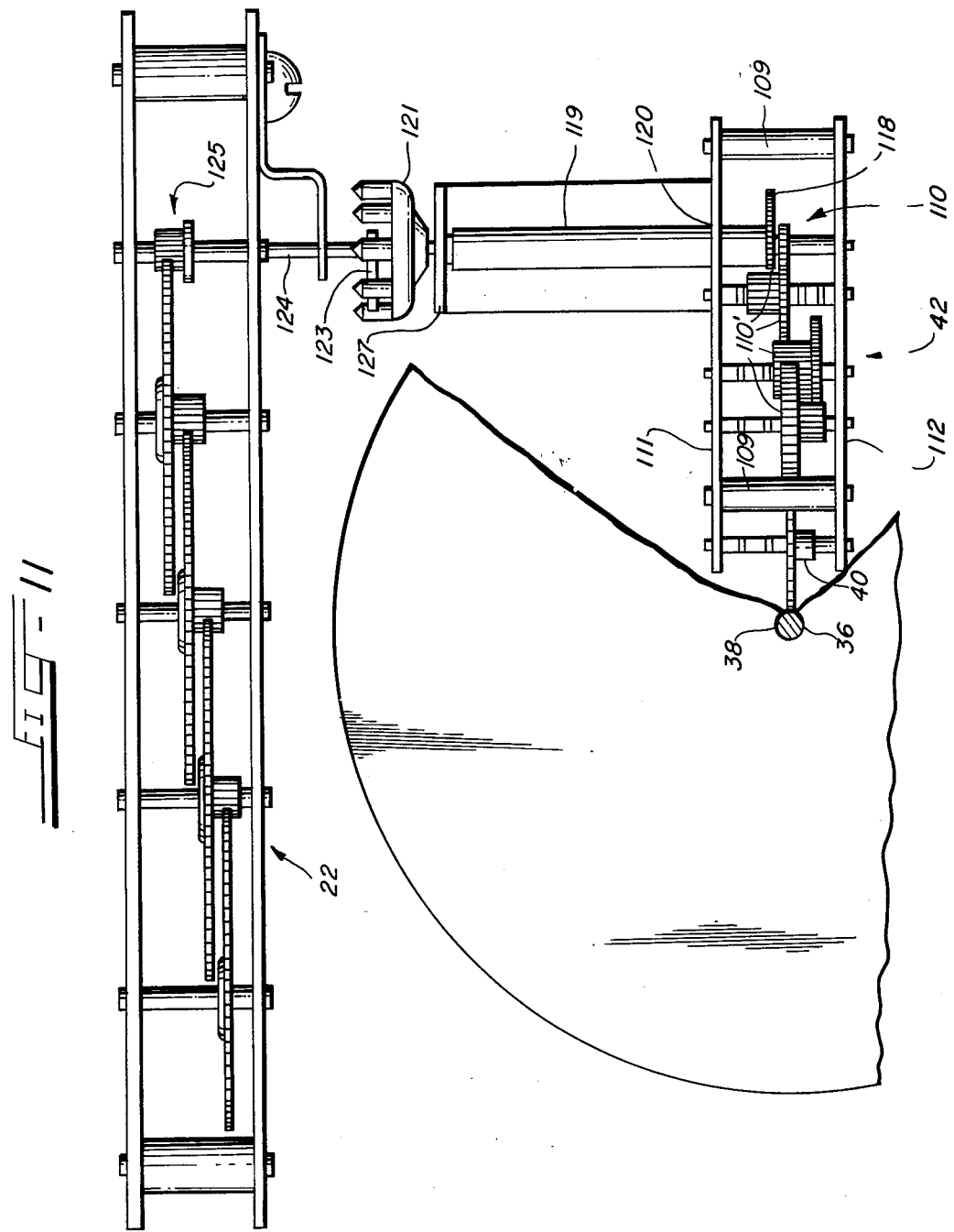

ROTATING DISC MULTIELEMENT POLYPHASE METER

BACKGROUND OF THE INVENTION

1. Field of the Invention

This invention relates to electrical meter devices, and more particularly to two-element, single disc polyphase watthour meters.

2. Description of the Prior Art

Multi-element, single disc polyphase watthour meters have been employed for metering polyphase systems for a long time. In recent years, manufacturers have directed their efforts toward producing multielement meters which provide more accurate readings, are simpler to adjust and which are more compact and of lower cost.

A major problem in single-disc multi-element polyphase meters is the interference between the two elements of such meters. As indicated in AIEE Transaction Paper, No. 55-483, by W. I. Schmidt, which is entitled "The Design of a New 2-Element, Single-Disc Polyphase Meter," made available for printing on June 1, 1955, the interference arises from interactions between eddy currents in the disc and fluxes from the electromagnetic poles of the two electromagnetic elements. The interactions include voltage interference, current interference, and voltage-current interference.

Voltage interference and current interference has been substantially eliminated by arranging the two electromagnetic elements symmetrically with respect to the center of the disc. Generally the elements are mounted on a frame secured to a baseplate so as to be positioned in a pair of parallel spaced planes extending between front and rear areas of the meter and thus perpendicular to the baseplate. The problem of voltage-current interference has been more difficult to eliminate. As proposed in the Transaction Paper referenced above, one solution to the problem of voltage-current interference is obtained through the use of compensating windings on the voltage poles. However, the addition of such compensating windings increases the cost of the meter.

The use of a second electromagnetic element in polyphase meters also complicates the light load and phase balance adjustments required to obtain accurate indications of power usage. The presence of two electromagnetic elements operating on a common disc results in interactions not experienced in single element meters. Thus, efforts have been made to simplify the design of light load and phase balance adjusters.

As indicated above, in known multi-element meters, the two elements are mounted perpendicular to the baseplate. While such mounting arrangement does not necessarily require an increase in the size of the meter, it does generally preclude reduction in the size of the meter which would provide a more compact unit. Also, such mounting arrangement necessitates the use of a mounting plate and frame which are different from the ones used for single element meters, for example. Accordingly, the production costs for multi-element polyphase meters, which are relatively low volume units as compared to single element meters, are higher than those for single element meters, particularly due to the need for two or more castings and the use of non-standard parts, that is, parts not used in single element meters.

A further consideration is that the electrical power systems in which watthour meters are used may have a number of ratings, and the watthour meters, which may be either single or multi-element meters, are required to register power usage in systems where the voltage may be 120 VAC or 240 VAC, and the nominal current may be 2.5, 15 or 30 amps. This requires production of five different registers, having different gear trains, to permit the dial indicators to provide the correct reading for a given rating.

It would be desirable to have a multi-element polyphase watthour meter in which voltage-current interference is minimized without the need for an additional compensating winding. It would also be desirable to have a polyphase watthour meter having improved accuracy and simplified balance adjustments, and which is more compact and of lower cost than known multi-element meters. It would further be desirable to have a watthour meter which is readily adaptable for use in measuring power usage for power systems of different power ratings.

SUMMARY OF THE INVENTION

It is an object of the present invention to provide a two-element polyphase watthour meter which minimizes voltage-current interference between the two elements.

A further object of the invention is to provide a multi-element polyphase watthour meter of improved accuracy and having simplified balance adjustments.

Another object of the invention is to reduce the size and manufacturing cost for a multi-element polyphase watthour meter.

Yet another object of the invention is to provide a watthour meter which is readily adaptable for use in measuring power uage in power systems having different ratings.

The present invention has provided a single-disc multielement polyphase watthour meter for measuring power consumption of an electrical circuit. The meter includes first and second electromagnetic element means each including potential and current magnetic structures and winding means effective when energized for establishing a shifting magnetic field for operating on a common electroconductive disc. The disc is mounted for rotation about a vertical axis under the influence of torques generated by the electromagnetic element means as a function of power consumption by an electrical circuit. The disc is coupled to a register means which provides a visual indication of such energy consumption.

In accordance with the present invention, the meter includes a mounting frame which mounts the first and second electromagnetic element means at diametrically opposed positions relative to the disc so as to minimize voltage interference and current interference between the potential and current magnetic structures of the two electromagnetic element means. In addition, the first and second electromagnetic element means are mounted on the frame with longitudinal axes thereof respectively located in planes which extend parallel to a base plate of the meter to which the frame is secured.

It has been found that such parallel mounting of the electromagnetic element means minimizes voltage-current interference between the two element means without the need for a compensating winding or the like, which adds cost to the meter.

In order to control the influence of the electromagnetic element means on the disc, the meter includes balance adjust means and light load adjust means. The balance adjust means, which is associated with the potential magnetic structure of the first electromagnetic element means permits balancing of the torques provided by the two electromagnetic element means to provide substantially identical torques for identical operating conditions for the two element means. Only one balance adjust means is required.

A counter compensation means, embodied as a shorted coil on the current magnetic structures of the two element means, provides compensation for phase angle error resulting from overcompensation by the phasing band on the potential coil, as well as for temperature affects.

The light load adjust means, which is associated with the potential magnetic structure of the second electromagnetic element means, is provided to control the response of the meter to light load conditions of the electrical circuit.

In accordance with a feature of the invention, interference between the two electromagnetic element means is further reduced through the use of a bridging strip member which extends between the potential magnetic structures of the two electromagnetic element means to reduce the interaction of stray fields in remote regions of the disc.

The mounting of the two electromagnetic element means to lie in planes extending parallel to the base plate permits the rear electromagnetic element means to be located in a cavity formed by the rear surface of the frame and an inner surface of the base plate, so that in effect, no additional room is needed in the forward portion of the meter for mounting the additional element required for multielement meters. This permits a reduction in size in order of 25 to 33% for the meter, providing a smaller, more attractive meter. Also, the mounting frame is a unitary structure having the necessary mounting extensions to permit mounting of the parts of the multielement meter in operative relationships. Thus, only one casting is required as opposed to the need for two or more castings employed in most known multielement polyphase meters.

Moreover, multielement meters at present are low production items when compared with single element meters, for example. The multielement meter of the present invention uses many parts which are used in single element meters, resulting in substantial cost savings. For example, the rear potential element, the light load adjuster, the full load adjuster, and the disc and associated upper and lower bearings are the same as those used in a single element meter. Also, the current magnetic structures are similar, and the base plate is conventional with the addition of an extra terminal for the potential windings. All other parts are simple variations of those used in existing single phase components.

In accordance with a further feature of the invention, the register means of the meter includes only decade gearing, and an input drive member of the decade gearing is coupled to the shaft which mounts the disc, by way of a coupling gear assembly means which includes ratio gearing which adapts the register for use in electrical circuits of different voltage and current ratings. Generally, meters may be employed in circuits having voltage ratings of either 120 VAC or 240 VAC, and nominal current ratings of 2.5 Amps, 15 Amps or 30 Amps, requiring a manufacturer to stock five different registers in order to provide a meter capable of registering power consumption on any one of the circuit installations. By way of example, the coupling gear assembly means may be provided in five different reduction ratings, permitting the use of a given register in a number of different applications.

DESCRIPTION OF THE DRAWINGS

FIG. 4 is a sectional view taken along lines 4—4 of FIG. 2;

FIG. 5 is a side view of the electromagnetic structures of the meter;

FIG. 6 is a perspective view of one of the potential magnetic structures of the meter;

FIG. 7 is a front elevational view of a rear potential magnetic structure of the meter;

FIG. 8 is a bottom view of the potential magnetic structure of FIG. 7;

FIG. 9 is a bottom view of the front potential magnetic structure;

FIG. 10 is a top view of a current element;

FIG. 11 is a detailed view of the register and associated gear coupling assembly; and FIG. 12 is a plan view of a bridging strip which links the potential magnetic structures shown in FIG. 5.

DESCRIPTION OF A PREFERRED EMBODIMENT

Figure 1:
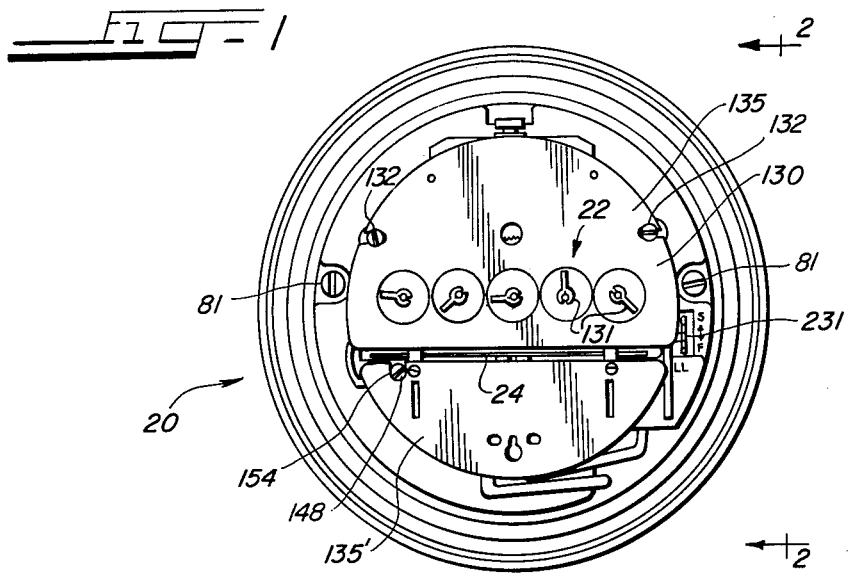
FIG. 1 is a front elevational view of a multielement polyphase watthour meter provided by the present invention.

Referring to the drawings, there is illustrated in FIG. 1 a multielement polyphase watthour meter 20 provided by the present invention. The watthour meter 20 which may be used for measuring the energy of a three-wire circuit (not shown) includes a multidial register 22 which provides a visual indication of energy consumed by an associated load (not shown). The register 22 is mechanically coupled to a suitable electroconductive armature 24 which in turn is driven by torque applied to the armature 24 by a pair of electromagnetic driving element assemblies 30 and 32, shown best in FIG. 2.

Figure 2:
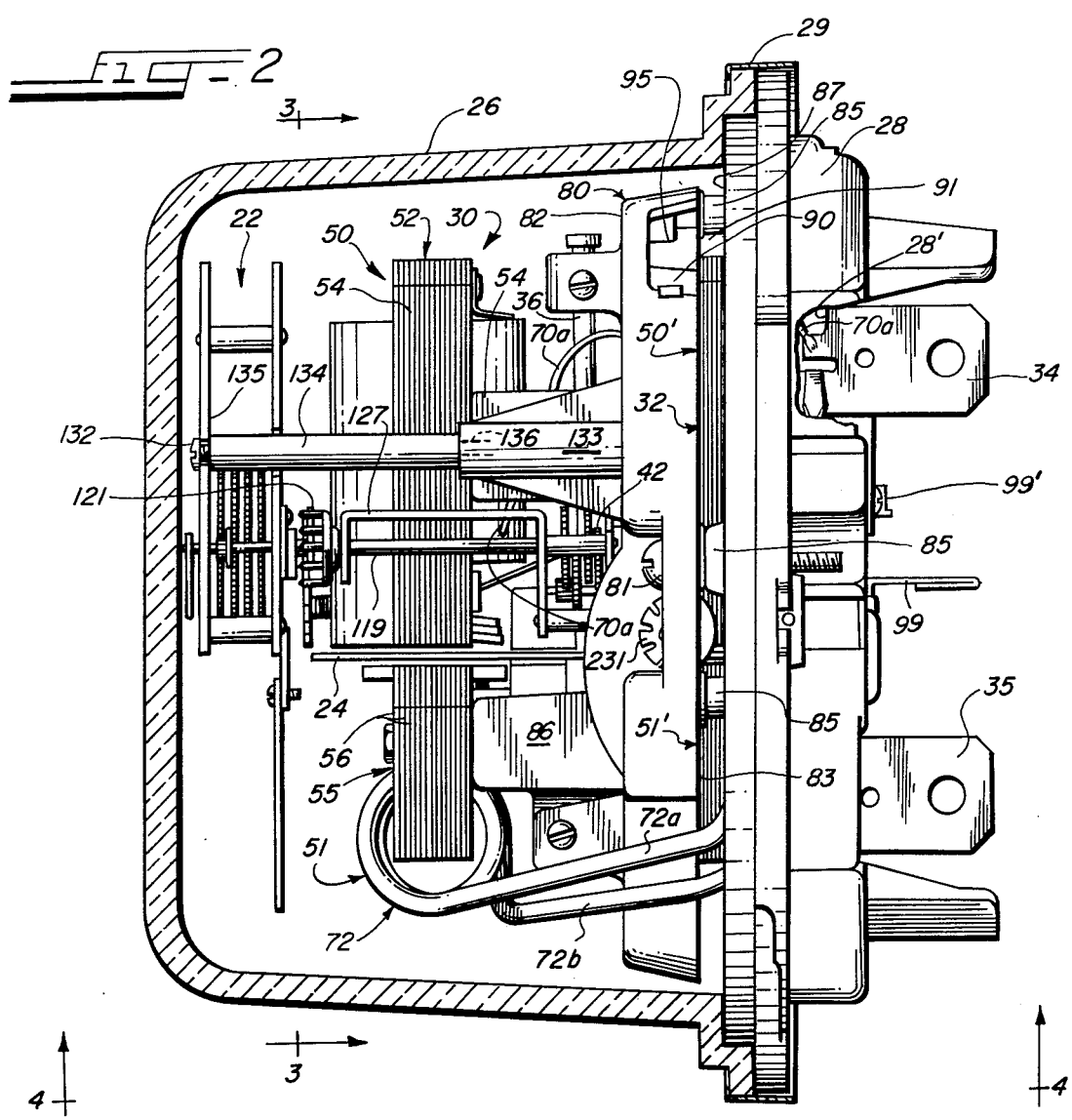
FIG. 2 is a side view of the meter shown in FIG. 1.

As illustrated in FIG. 2, the meter 20 is in the form of a detachable meter adapted for detachable engagement with a suitable socket receptacle (not shown) in a manner known in the art. The meter 20 includes a cover 26 preferably formed of a transparent material, such as glass, which is positioned to surround the operating parts of the meter 20. The cover 26 is secured to the base plate 28 in a suitable manner, such as by means of a rim structure 29.

As illustrated in FIGS. 2 and 5, each of the electromagnetic driving assemblies 30 and 32 is arranged to influence the electroconductive armature 24, illustrated in the form of a disc. The disc 24 may be constructed of any suitable electroconductive material, such as aluminum, and is mounted for rotation relative to the elements 30 and 32 about an axis by means of a shaft 36. The shaft 36 includes a worm gear portion 38 (FIG. 11) positioned to engage a suitable gear 40 forming part of a coupling gear box 42 which couples the shaft 36 to the register 22 in a manner to be described in more detail hereinafter.

Figure 3:
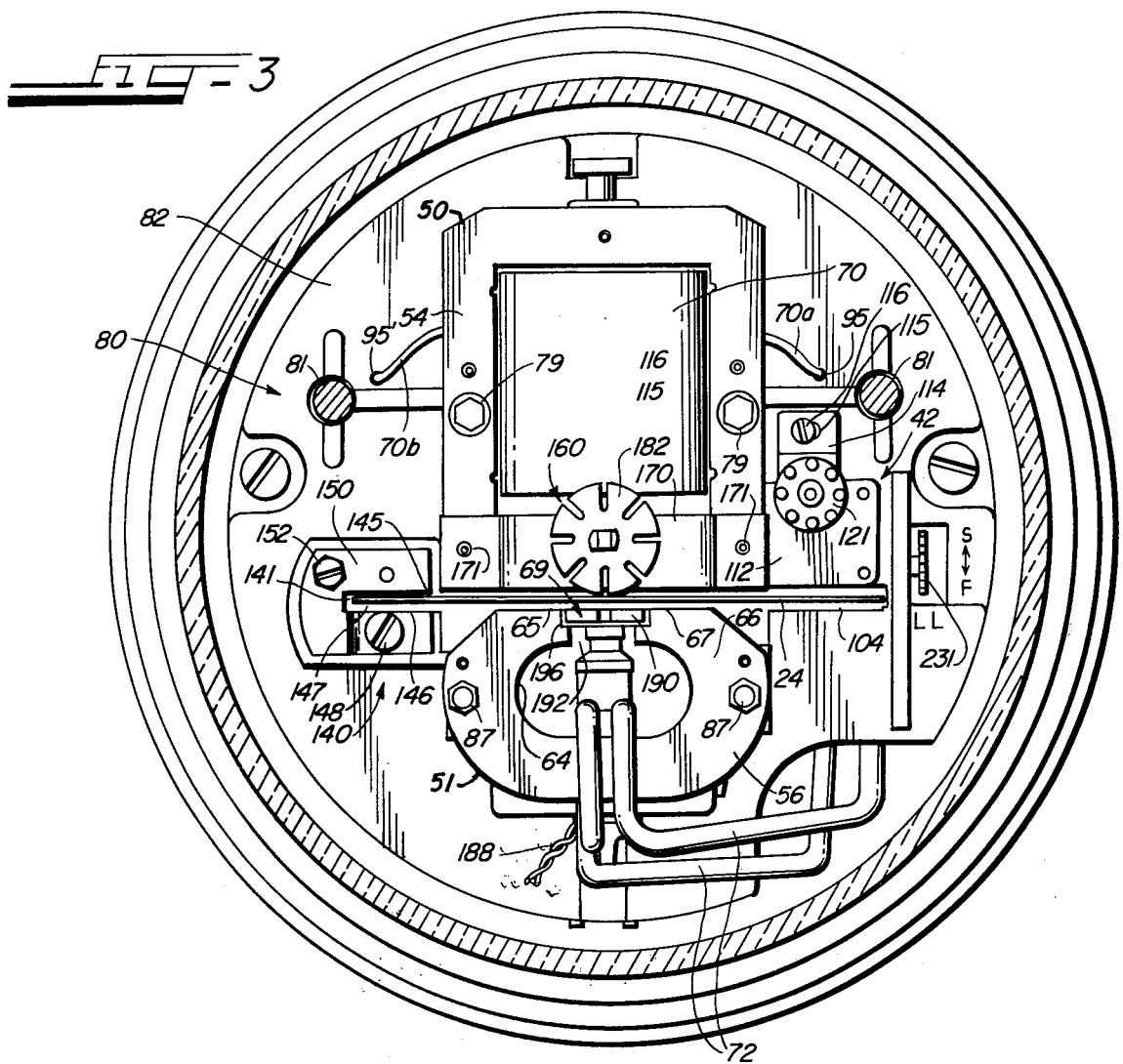
FIG. 3 is a sectional view taken along lines 3—3 of FIG. 2.

As illustrated in FIGS. 2 and 3, the assembly 30 includes a voltage coil 50 and a current coil 51. The voltage coil 50 includes a generally E-shaped magnetic structure 52 preferably formed of a plurality of identical magnetic laminations 54 each having the configuration illustrated in FIG. 6. The current coil 51 includes a C-shaped magnetic structure 55 preferably formed of a plurality of identical magnetic laminations 56 having the configuration illustrated in FIG. 3. The laminations 54 and 56 are preferably formed of a low-loss magnetic material, such as silicon steel. The structure 52 has a center leg 161 and two side legs 162 and 163, the ends of which define voltage magnetic poles 164–166, shown in FIG. 6. The magnetic structure 55 includes a pair of spaced current magnetic poles 64 and 66 having respective pole faces 65 and 67. The poles 65 and 67 are located in a common plane which is spaced from and parallel to the plane defined by the poles 164–166 to define an air gap 68. A suitable magnetic shunt 69 may be positioned between the current poles 64 and 66 to provide overload compensation as is understood in the art.

The assembly 32 is generally similar to assembly 30 and accordingly, in the drawings, similar components of the assemblies 30 and 32 are represented by the same reference numerals but with a prime notation added for the components of assembly 32.

In order to permit energization of the magnetic structures 50 and 51, the assembly 30 further includes a suitable voltage winding 70 which surrounds the center leg 161. The voltage winding 70 is preferably formed of a large number of turns of small cross-section conductor. The assembly 30 also includes a current winding 72 positioned to surround the current poles 64 and 66 to produce when energized magnetomotive forces for the poles 64 and 66 acting in opposing directions. The current winding 72 is preferably formed of a relatively few turns of a large cross-section conductor as compared to the voltage winding 70.

As shown best in FIG. 2, the ends 72a and 72b of winding 72 are welded to support blades 34 and 35, which extend through a pair of slots, 34a and 35a, in the base plate 28 (FIG. 3A), to facilitate connection to the load by way of a socket receptacle (not shown). The current winding 72' of the other driving assembly 32 also has ends connected to a pair of support blades, 34' and 35', which extend through a further pair of slots, 34a' and 35a', in the base plate 28.

Figure 3A:
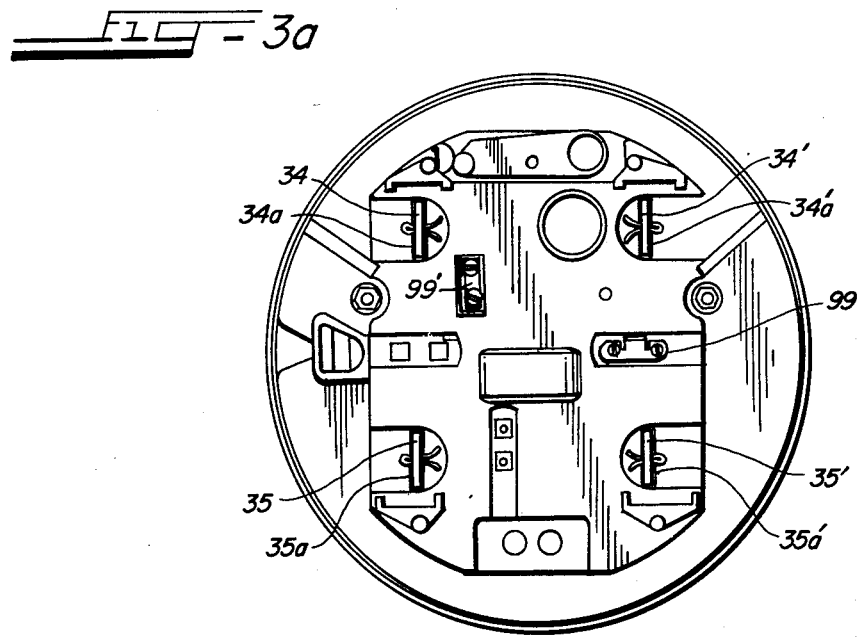
FIG. 3A is a rear elevational view of the meter shown in FIG. 1.

The ends 70a and 70b of the voltage winding 70 extend through holes 95 and 95' in the frame to the rear portion of the meter 20. One of the ends 70a is connected over a test link 99' to one of the support blades, such as support blade 34, and the other end 70b, together with one end 70b' of the winding 70' shown in FIG. 2, associated with the rear potential element 50', may be connected to a pair of tapped stud members extending through the base plate 28 and which mount a terminal 99 on the rear surface of the base plate 28 as shown in FIG. 3A. The other end 70a' of winding 70' may be connected to support blade 34' for the current winding 72'.

In order to mount the operating parts of the meter 20 to the base plate 28 of the meter 20 in operative positions a suitable mounting frame 80 is provided. The frame 80 may be constructed of a non-magnetic, electroconductive die casting material, such as aluminum die casting alloy. Such material being electroconductive, offers shielding against external magnetic fields.

The single casting has suitable mounting portions to permit mounting of the operative parts of the meter 20 in operative relationships, and also affords simpler assembly of the parts on the frame 80, resulting in lower assembly costs for the meter 20.

As shown in FIGS. 2 and 3, the frame 80 is of unitary structure construction, and is secured to the base plate 28 by way of a pair of mounting bolts 81 which thread apertures (not shown) in the base plate 28. The frame 80 is spaced apart from the base plate 28 by way of spacers 85 which are formed integrally on the peripheral edge 87 of the base plate.

The frame 80 mounts the magnetic assemblies 30 and 32 with the longitudinal axes thereof located in respective parallel spaced planes which extend parallel to the base plate 28 in front and rear areas of the meter 20. The front magnetic assembly 30 is mounted intermediate the register 22 and the frame 80. The rear magnetic assembly 32 is mounted in a cavity 91 defined by the rear surface 83 of the frame 80 and a concave inner surface 28' of the base plate 28.

The front potential element assembly 50, and the front current element assembly 51 are mounted on the front surface 82 of the frame 80, and the rear potential element assembly 50' and the rear current element assembly 51' are mounted on the rear surface 83 of the frame 80. The front potential element assembly 50 is mounted above the disc 24 with its poles 164–166 disposed adjacent the upper surface of the disc 24. The frame 80 has a pair of leg portions, such as leg portion 84 shown in FIG. 5, which extend perpendicular to the front surface 82 of the frame 80 and have tapped holes, such as hole 78, to receive mounting screw 79, which secures the potential assembly 50 to the mounting legs 84 in a spaced relationship with the front surface 82 of the frame 80.

The current element assembly 51 is mounted below the disc 24 with its pole faces 65 and 67 disposed adjacent to the lower surface of the disc 24. The pole faces 65 and 67 are spaced apart from the poles 164–166 of the voltage element 50 defining an air gap 68 in which the disc is located. The frame 80 has a further pair of mounting legs 86 (FIG. 4) which extend perpendicular to the front surface 82 of the frame 80 a parallel spaced relation and to which is secured the current element assembly 51 by way of screws 87, which thread tapped holes 88 in the legs 86. The frame 80 has cutout portions, such as cutout portion 96 shown in FIG. 4, which permit the current leads, such as leads 72a and 72b to be extended to the contact blades 34 and provide support for the leads.

Similarly, the rear potential element assembly 50' is mounted to the rear surface 83 of the frame 80 by way of raised portion 90 thereof (FIG. 2) and is secured to the raised portion 90 by way of mounting screws, such as screw 91 which threads a tapped hole 92 is the mounting portion 90 as shown in FIG. 5.

The rear current element assembly 51' is secured to the frame 80 by way of extension portions 93 shown in FIG. 4 and is secured to the extension portion 93 by way of screws, such as screw 94, which threads a tapped aperture 95 in the extension portion 93 as shown in FIG. 5.

As shown in FIG. 2, the magnetic element 30, including the front potential element 50 and the front current element 51, are mounted on the frame 80 to lie in a plane extending parallel to the frame 80, and thus parallel to the base plate 28. The magnetic assembly 32, including the rear potential element 50' and the rear current element 51', are mounted to lie in a plane which extends parallel to the frame 80 and to the base plate 28.

It has been found that when the magnetic elements 30 and 32 are mounted to extend parallel to the frame and the base plate 28, as in accordance with the present invention, the voltage-current interference, generally encountered in multielement polyphase watthour meters, is minimized.

The frame 80 also mounts the register 22 and the shaft 36 mounts the disc for rotational movement past the electromagnetic elements 30 and 32. Referring to FIG. 5, in order to mount the shaft 36 and the disc 24 for rotation relative to the magnetic structures 30 and 32, the frame 80 is provided with a pair of projections 100 and 101 which extend from the front surface 82 of the frame 80. Suitable upper and lower bearing assemblies 102 and 103 are supported respectively, by the projections 100 and 101 to mount the shaft 36 for rotation about a vertical axis extending midway between the two magnetic elements 30 and 32. The disc 24 is secured to the shaft 36 in a suitable manner, and is positioned to extend through the gaps 68 and 68' provided by the magnetic structures 30 and 32. As shown in FIG. 3, the frame 80 has a slot 104 which permits the disc 24 to extend through the frame 80. The gaps 68 and 68' are aligned to lie in a plane extending transverse to the planes in which the assemblies 30 and 32 are mounted.

In accordance with the present invention, the register 22 includes only decade gearing, and the coupling gear box assembly 42, which drives the register 22, includes ratio gearing related to the current and voltage ratings for the circuit to enable the register 22 to be driven to provide an indication of power consumption by the circuit. The register 22 and the coupling gear assembly 42, which couples the shaft 36 to the register 22 are also mounted on the frame 80. Referring to FIG. 11, the coupling gear assembly 42 includes a reduction gear train 110 the individual gears and pinions 110' of which are shaft mounted between front and rear plates 111 and 112, respectively, and staked at each end. The coupling gear assembly 42 is mounted to permit a take-off gear 40 to engage the worm gear portion 38 of the disc shaft 36. Referring to FIG. 3, the coupling gear assembly 42 is removably secured to the front surface 82 of the frame 80 by way of a mounting ear 114, formed integrally with the rear plate 112, and which has an aperture 115 through which extends a screw 116 which is received in threaded engagement in a tapped hole in the front surface 82 of the frame 80.

Referring again to FIG. 11, the output of the coupling gear assembly 42 is taken from the output gear 118 by way of a shaft 119, which extends through an aperture 120 in the front plate 111, and is coupled to an input shaft 124 of the register drive train 125 by way of a coupling link, including a spider member 121 carried by the end of the shaft 119 and a drive dog 123 carried by the input shaft 124 of the register drive train 125. A generally U-shaped support member 127 (FIG 2), formed integrally with the front plate 111 provides support for the shaft 119 adjacent the spider member 121.

Referring to FIG. 1, the register 22 includes a dial plate 130 over which a plurality of digit indicators 131 pass in response to actuation thereof by the decade gearing 125. The gear train 125 is actuated in turn from the shaft 36 by the intermediate coupling gear assembly 42. The register 22 is detachably secured to the frame 80 by way of screws 132 which are received in threaded apertures formed in the pillars, such as pillar 133 (FIG. 2) which are formed integrally with the front surface 82 of the frame 80. A cylindrical spacer 134, interposed between the front plate 135 of the register 22 and the tapped surface 136 of the pillar 133, maintains the register 22 in the forward portion of the meter 20.

The coupling gear box 42 may be provided with five different reduction ratios to permit application of a given register 22 in circuits which have voltage ratings of either 120 VAC or 240 VAC, and current ratings of either 2 Amps, 15 Amps or 30 Amps, for example. By way of example, the coupling gear box 42 for use in a 120 VAC application may have either one of the following reduction gear ratios: 166 2/3; 27 7/9; or 13 8/9 for current ratings of 2.5, 15, or 30 amps, respectively. For 240 VAC applications, units having the following reduction ratios may be provided: 83 1/3; 13 8/9; or 6 17/18 for 2.5, 15, or 30 Amp ratings, respectively.

It is pointed out that while the meter register 22 and associated coupling gear assembly 42 are described with reference to an application in a polyphase watthour meter, such arrangement may also be used in a single element watthour meter or other types of apparatus which employ a multidigit register.

Thus, the ratio gearing is in effect part of the meter, and the register 22 includes only decade gearing as required to drive the digit indicators 131. The register 22 is detachably secured to the frame 80, permitting substitution of registers having different numbers of dials in a given meter. As indicated above, no ratio gearing is used in the register 22, and different types of registers — cyclometers, two rate, demand — can be stocked by a manufacturer in only one ratio-free embodiment for use in many different meters, regardless of voltage and current ratings for the current with which the meter is used.

For the purpose of damping rotation of the disc 24 a magnetic damping assembly is positioned to influence the disc 24. As illustrated in FIG. 3, the damping assembly 140 includes a pair of permanent magnets (not shown) enclosed within a generally rectangular shell 142, shown best in FIG. 4, which is formed integrally with the front surface 82 of the frame 80 and is centered about the slot 104 in the frame 80 through which passes the disc 24. The magnets are disposed in a parallel spaced configuration with magnetically opposed poles having pole faces 145 and 146 defining gap 147 in which extends the peripheral edge of the disc 24.

The magnets may be constructed of any suitable magnetic material, preferably a high coercive material, such as high cobalt permanent magnet steel. The frame is die-cast around the magnet. The magnet is effectively shielded against external magnetic fields by means of the frame 80.

Magnetic flux of the magnet crosses the gap 147 from pole face 145 to pole face 146. A portion of the disc 24 traverses the gap 147 to intercept flux from the magnet. For the purpose of adjusting the amount of damping of the disc 24, there is provided a damping adjust assembly in the form of an adjustable screw 148 and a generally U-shaped mounting bracket 150, both of a magnetic permeable material. The bracket 150 is secured to the shell 142 by way of a screw 152 and has an offset leg portion 153 (FIG. 4) in which is received the adjustment screw 148 in threaded engagement.

The damping adjustment assembly provides a low reluctance path for flux of the magnet. The screw 148 is adjustable to increase or decrease the flux in the gap 147, and thus the amount of flux passing through the disc 24. A retainer spring 151 is provided to hold the screw 148 in any position to which it may be adjusted.

The damping screw 148 is actuable from the front of the meter 20, the slotted head of which is accessible through a cutout 154 in a front plate 135' of the meter register 22 as shown in FIG. 1.

In order to cause the magnetic elements 30 and 32 to apply substantially equal torques to the disc 24 for identical conditions of energization of the elements 30 and 32, suitable balance adjusting apparatus 160, shown in FIGS. 3, 6, and 9, is provided for adjusting the torque applied by element 30. As illustrated in FIG. 3, the balance adjust apparatus 160, which is associated with the front potential magnetic structure 50, is operable to vary the basic torque of the front potential element 50 to permit the torques to be equalized at a common load point, typically 100% rated load.

Referring to the simplified representation of the front potential magnetic structure 50, shown in FIG. 6, the magnetic structure 52 is comprised of a plurality of E-shaped laminations 54, having a center leg 161 and two outer legs 162 and 163. The poles 164, 165 and 166 of the legs of the E-shaped core 52 adjacent the disc 24 are spaced apart to provide leakage gaps 167 therebetween. It will be understood that the flux which is effective in applying torque to the disc 24 is that portion of the flux which flows from the outer legs 162 and 163 to the inner leg 161 and through the disc 24. By adjusting the amount of flux flowing between these legs, it is possible to adjust the torque that is applied for driving the disc 24. Most of the flux goes through the gap 167, and only a small portion, say 15 to 30% goes through the disc 24.

The conventional lag loop 168 is provided around the middle leg 161 in order to provide the desired flux relationships as will be readily understood.

In order to adjust the flux that threads the disc 24 for varying the torque of the element, a magnetic shunt member 170 in the form of a strip of high permeability magnetic material is bent in the form shown in FIG. 9, and secured to the core 50 by rivets 171 that extend through transverse apertures 172 therein. The magnetic shunt member 170 is non-adjustably mounted to the core 52. A suitable frame member 172' is secured to the core 52 on the side of the core 55 opposite the magnetic shunt member 170 by way of the rivets 171.

Intermediate the ends of the magnetic shunt member 170, a threaded aperture 176 is provided for threadably mounting an adjustment screw 178 that is formed of a magnetic material having relatively high permeability. One end of the screw 178 is provided with a cylindrical end portion 179 that is arranged to move longitudinally in a transverse aperture 180 that extends through the middle leg 161 of the core 52. At its other end, the screw 178 is provided with an adjust wheel 182. A retainer spring 184 is disposed between the magnetic shunt member 170 and the adjust wheel 182 in order to hold the screw 178 in any position to which it may be adjusted.

If it is desired to increase the torque that assembly 30 applies to the disc 24, the screw 178 may be turned in such direction as to withdraw the cylindrical end portion 179 thereof from the aperture 180. The adjustment causes less flux to be shunted around the disc 24 and more flux to thread the disc 24, thereby increasing the torque applied to the disc 24. The torque is decreased by turning the screw 178 in the opposite direction, causing less flux to thread the disc 24. The gap 167 can be varied to change the torque by approximately 15%.

When adjusting the phase balance, one tends to over compensate, and as a result, there may be a phase angle error in the other direction, that is the line voltage is now more than 90° from the output flux. Accordingly, current element 51 is provided with a counter compensation winding 188 for current element 51, shown in FIG. 3. The winding 188 comprises two or three turns of copperwire which are wound on the current magnetic core 55, and have ends of nickel wire twisted together and soldered, forming a shorting loop. The meter 20 is calibrated to work at low power factor, and the nickel wire, having a high change in resistance with temperature increase provides a convenient way of obtaining Class II temperature compensation.

Referring to FIGS. 3 and 10, for the purpose of providing compensation for current damping of the disc 24 at high loads, each of the current elements 51 and 51' include an overload bridge assembly, such as overload bridge assembly 69 for current core 51. The overload bridge assembly 69 includes a generally T-shaped bridge member 190 of iron, having a leg portion 191 which extends through the gap 192 between the current poles 65 and 67, and a spacer member 196 of brass, for example, which encircles the part of the portion 191 which lies between the poles 65 and 67.

When the bridge member 190 is unsaturated, flux is shunted away from the disc 24. However, the bridge member 190 becomes saturated at higher loads, permitting more flux to pass through the disc 24, increasing the torque on the disc 24 at higher loads.

A suitable light load adjuster 200 is provided to control the response of the meter 20 to light load conditions of the circuit (not shown). The adjuster 200 is associated with the rear potential magnetic structure 51'. As shown in FIGS. 7 and 8, the light load adjuster 200 includes an electroconductive member 202 which is positioned beneath the voltage poles of the magnetic structure 52' in the path of the voltage flux to intercept a portion of the voltage flux traversing the gaps between the poles of the potential magnetic structure 52'. The structure 52' comprises a plurality of E-shaped laminations 54' which are similar to those of the front potential core 52 (FIG. 6). The electroconductive member 202 is shown in the form of a closed loop effective to lag a portion of the voltage flux to develop a torque which is applied to the disc 24. For the purpose of providing a variable torque, the member 202 is mounted for adjustment relative to the voltage poles, including voltage pole 164' for the center leg, and voltage poles 165' and 166' for the outer legs of the E-shaped core 52', to intercept a portion of the flux.

To this end, a suitable actuating mechanism 204 is provided which is actuable to effect movement of the member 202 relative to the voltage poles along an axis extending parallel to the plane of the magnetic structure 52'. As shown best in FIG. 7, the member 202 is carried by a U-shaped member 210 having vertically extending end portions 211 and 212. A mounting bracket 214 of magnetic material is provided for mounting the member 210 by way of an adjustment screw 216 which extends through apertures 217 and 219 in respective end portions 218 and 220 of the mounting bracket 214, and also through apertures 221 and 222 in the member 210, aperture 221 being threaded to receive a threaded shank portion 224 of the screw 216, permitting controlled movement of the member 210 and thus of the electroconductive member 202 carried thereby relative to the voltage poles 164', 165' and 166'. The mounting bracket 214 is secured to the core 52' by way of rivets 226 which extend through transverse apertures 227 therein. A suitable frame member 228 is also secured to the core on the side opposite the actuating mechanism 204 by way of the rivets 226.

A retainer spring 229 is positioned around the shank of the screw 216 between the end portion 211 of the member 210 and end portion 220 of the bracket 214 to maintain the screw 216 in any position to which it may be adjusted.

The customary lag loop 230 is provided around the middle leg of the core 52' in order to provide the desired flux relationships as is known in the art.

The light load adjuster 200 is adjustable from the front area of the meter 20 by way of an adjust wheel 231 shown in FIG. 1, which is secured to the end of the adjustment screw 216. Movement of the wheel 231 effects movement of the electroconductive member 202 relative to the voltage poles. The member 202 is positioned so that the compensation torque produced by the member 202 tends to rotate the disc 24 in the direction in which the disc 24 normally rotates. Since a certain portion of the voltage flux is continuously linked by the member 202, the compensation torque includes a constant portion which supplies compensation for light load error.

For the purpose of reducing stray fields in the remote regions of the disc 24, there is provided a bridging strip 240, shown in FIGS. 5 and 12, which is positioned with ends 241 and 242 engaging the transverse apertures formed in the magnetic structures 52 and 52' of the front and rear potential elements 50 and 50'. The strip 240 is generally rectangular in shape and has tapered ends 241 and 242 to permit the ends to be inserted into the apertures, such as aperture 180 (FIG. 9) for the magnetic core structures 52 and 52'. The portion 244 of the strip 240, which is intermediate ends 241 and 242, is bowed upwardly and is cut out to fit around the shaft 36 which carries the disc 24.

The bridging member 240 is formed preferably of high permeability material in order to provide the desired neutralizing effect. Its width throughout its entire length is sufficient to prevent components of the stray magnetic field of either magnetic element 50 and 50' from reacting with components of eddy currents from the other magnetic structure and producing an undesireable torque in the disc 24.

I claim:

1. A polyphase watthour meter for measuring electrical power consumption for an electrical circuit, a base plate having an inner concave surface; a supporting frame member comprising a casting of non-magnetic, electroconductive material; said casting having a generally disc-shaped body portion extending parallel to said base plate and including a first concave surface disposed adjacent to said concave surface of said base plate and cooperating therewith to define a cavity, and a second surface facing the front of said meter; first fastener means for securing said supporting frame to said base plate; first and second electromagnetic means each having an air gap, said first and second electromagnetic means each having a longitudinal axis; said casting providing first spacer means extending toward said base plate, second spacer means extending from said second surface thereof toward the front of said meter, third spacer means extending from said second surface thereof and located outside said second spacer means, a pair of diametrically spaced projections on said second surface, and a housing on said second surface; second fastener means for mounting said first electromagnetic means to said first spacer means and in said cavity; third fastener means for mounting said second electromagnetic means to said second spacer means with the longitudinal axes of said first and second electromagnetic means located respectively in first and second parallel spaced planes which extend parallel to said base plate with associated air gaps in alignment in a third plane which extends perpendicular to said first and second planes; a shaft rotatably mounted to said projections on said frame casting; an electroconductive disc mounted on said shaft for rotation about an axis extending substantially perpendicular to said third plane and through the aligned air gaps; winding means for each of said electromagnetic means effective when energized to establish a shifting magnetic field in the associated air gap to apply a torque to said disc for rotating said disc in correspondence with power consumption by said circuit; damper magnet means mounted in said housing of said frame casting; a register; fourth fastener means for securing said register to said third spacer means of said frame casting in a forward portion of the meter; and a coupling gear box assembly mounted on said frame casting in operative relationship with said register for coupling said shaft to said register to permit said register to be driven in correspondence with the revolutions of said disc.

2. A watthour meter as set forth in claim 1 wherein said first electromagnetic means includes a first potential magnetic structure having voltage magnetic poles and a first current magnetic structure having current magnetic poles, said first potential magnetic structure and said first current magnetic structure being mounted to said second spacer means of said frame casting with corresponding magnetic poles disposed in a spaced relationship to define the associated air gap, and wherein said second electromagnetic means includes a second potential magnetic structure having voltage magnetic poles and a second current magnetic structure having current magnetic poles, said second potential magnetic structure and said second current magnetic structure being mounted to said third spacer means of said frame casting with corresponding magnetic poles disposed in a spaced relationship to define the associated air gap.

3. A watthour meter as set forth in claim 2 which includes a bridging strip member of magnetic material extending between said first and second potential magnetic structures, said member being substantially rectangular in shape and having tapered end portions which engage apertures in said first and second potential magnetic structures adjacent to the voltage magnetic poles thereof, said member being bowed intermediate said ends so as to extend above said disc for reducing components of stray magnetic fields in remote regions of said disc.

4. A watthour meter as set forth in claim 1 wherein said register has a plurality of digit indicators and a decade gear drive train for driving said digit indicators, and wherein said coupling gear box assembly includes a reduction gear drive train having an input drive member coupled to said shaft and an output drive member, and coupling means for coupling said output drive member to an input drive member of said decade gear drive train, said reduction gear drive train having a reduction ratio related to voltage and current ratings for said circuit to cause said digit indicators of said register to be driven to provide an indication of power consumption by said circuit.

5. A watthour meter as set forth in claim 4 wherein said coupling means includes an output drive shaft carried by said output drive member, a spider member carried by said output drive shaft, and a drive dog carried by said input drive member of said decade gear drive train.

6. A watthour meter as set forth in claim 5 wherein said coupling gear box assembly includes first and second plate members and means for mounting said plate members in a parallel spaced relationship, and a plurality of gears which comprise said reduction gear drive train which are supported between said first and second plate members, and a mounting gear formed integrally with one of said plate members for mounting said coupling gear box assembly on said frame member.

* * * * *